United States Patent [19]

Nakashima et al.

[11] 4,236,169

[45] Nov. 25, 1980

[54] THYRISTOR DEVICE

[75] Inventors: Yoichi Nakashima; Yosikazu Takita; Sousi Suzuki; Katsumi Akabane; Michihiro Misawa, all of Hitachi, Japan

[73] Assignee: Hitachi, Ltd., Japan

[21] Appl. No.: 49,889

[22] Filed: Jun. 19, 1979

[30] Foreign Application Priority Data

Jun. 19, 1978 [JP] Japan ................................. 53-73179

[51] Int. Cl.³ ........................................... H01L 29/747
[52] U.S. Cl. ....................................... 357/39; 357/38; 357/55; 357/58; 357/86; 357/90
[58] Field of Search ..................... 357/38, 39, 86, 58, 357/55, 90

[56] References Cited

U.S. PATENT DOCUMENTS

| 3,538,401 | 11/1970 | Chu ........................................ 357/38 |
| 3,693,054 | 9/1972 | Anderson ............................... 357/86 |
| 3,727,116 | 4/1973 | Thomas et al. ........................ 357/38 |
| 3,947,864 | 3/1976 | Yatsuo et al. .......................... 357/39 |
| 3,961,354 | 6/1976 | Kunasata et al. ...................... 353/38 |
| 3,978,514 | 8/1976 | Ogawa et al. .......................... 357/39 |

FOREIGN PATENT DOCUMENTS

| 2214187 | 9/1973 | Fed. Rep. of Germany ............. 357/39 |
| 2232916 | 12/1973 | Fed. Rep. of Germany ............. 357/38 |
| 2659909 | 11/1977 | Fed. Rep. of Germany ............. 357/38 |
| 316538 | 10/1969 | Sweden ................................ 357/38 |

OTHER PUBLICATIONS

L. Greenberg et al., "ITR–A New Reverse Cond. Thyristor for Horiz. Defl.", RCA Engineer, vol. 19, #3, Oct./Nov. 1973, pp. 86–88.

Primary Examiner—Joseph E. Clawson, Jr.
Attorney, Agent, or Firm—Craig and Antonelli

[57] ABSTRACT

A semiconductor substrate comprises at the central portion a diode region which includes a P-type base layer, an N-type low impurity concentration layer and an N-type base layer and at the outer peripheral portion a thyristor region which includes an N-type emitter layer, a P-type base layer, an N-type low impurity concentration layer, an N-type base layer and a P-type emitter layer. The P-type base layer and the N-type emitter layer are in contact with a cathode electrode, the N-type base layer and the P-type emitter layer are in contact with an anode electrode, and the diode and thyristor regions are connected in anti-parallel. Contiguous to the outer periphery of the N-type base layer interposed between the N-type low impurity concentration layer and the P-type emitter layer is formed an N-type high impurity concentration region higher in impurity concentration than the N-type base layer. The N-type high impurity concentration region limits spreading of a depletion layer which is created when a forward voltage is applied to the thyristor region.

4 Claims, 2 Drawing Figures

THYRISTOR DEVICE

BACKGROUND OF THE INVENTION

This invention relates to thyristor devices and in particular, a thyristor device which does not require a high reverse breakdown voltage.

As disclosed in U.S. Pat. No. 3,538,401 to Chang K. Chu issued on Nov. 3, 1970, a type of thyristor is well known wherein an N-type emitter layer, a P-type base layer, an N-type low impurity concentration layer, an N-type base layer of an impurity concentration higher than that of the N-type low impurity concentration layer, and a P-type emitter layer are formed in this order. When a voltage is applied across the P-type emitter layer and the N-type emitter layer of this type of thyristor with the positive polarity for the P-type emitter layer and the negative polarity for the N-type emitter layer, the applied voltage is mostly concentrated across a PN junction at the interface between the P-type base layer and the N-type low impurity concentration layer. This voltage is reverse to the PN junction and depletion layers are then created on opposite sides of the PN junction.

Since these depletion layers on the opposite sides tend to so spread as to equalize electric charges in the two depletion layers, the formation of the depletion layer is more extensive in the N-type low impurity concentration layer of a lower impurity concentration than in the P-type base layer.

Spreading of the depletion layer is, however, limited by the N-type base layer which is higher in impurity concentration than the N-type low impurity concentration layer. As a result, this depletion layer reaches a PN junction formed between the N-type base layer and the P-type emitter layer, thereby increasing the break-over voltage, i.e., the so-called punch-through voltage and hence the forward blocking voltage.

Although a high impurity concentration in the N-type base layer is followed by the increased punch-through voltage and the correspondingly increased forward blocking voltage of the thyristor, the forward on-state voltage when the thyristor is in conduction is also increased to thereby increase power loss during the conduction state. This is because the injection efficiency of minority carriers from the P-type emitter layer to the N-type base layer is lowered. Therefore, the impurity concentration in the N-type base layer is limited to $5 \times 10^{16}$ atoms/cm$^3$ at the PN junction portion between the P-type emitter and N-type base layers, preventing a sufficiently high forward blocking voltage of the thyristor from being obtained.

SUMMARY OF THE INVENTION

An object of this invention is to provide a thyristor having a high forward blocking voltage even with a low forward on-state voltage.

Another object of this invention is to provide a reverse conducting type thyristor having a high forward blocking voltage even with a low forward on-state voltage.

In accordance with one feature of this invention, a high impurity concentration region is provided at the outer periphery of an N-type base layer, the impurity concentration of the region being higher than that of the N-type base layer.

In accordance with another feature of this invention, a diode region and a thyristor region connected in anti-parallel are formed in one semiconductor substrate at the central portion and peripheral portion thereof, respectively, and a high impurity concentration region is provided at the outer periphery of an N-type base layer in the thyristor region, the impurity concentration of the former being higher than that of the latter.

DESCRIPTION OF THE PREFERRED EMBODIMENT

Figure 1:
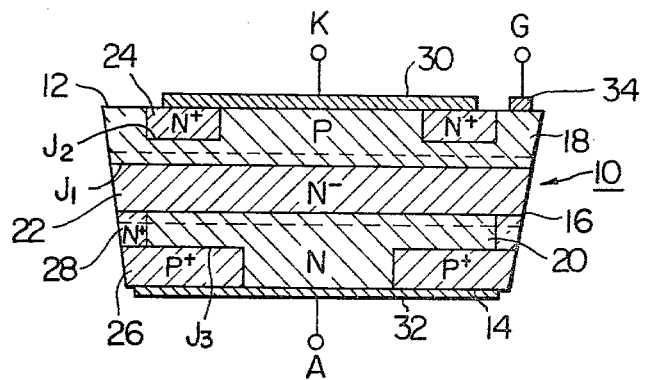
FIG. 1 is a longitudinal section view of a thyristor embodying this invention.

With reference to FIG. 1 in which is best illustrated the construction of a thyristor preferably embodying this invention, a semiconductor substrate 10 comprises two major opposed surfaces 12 and 14 and a side surface 16 connecting the two major surfaces. Contiguous to the major surfaces 12 and 14 are formed a P-type base layer 18 and an N-type base layer 20, respectively. Between the P-type base layer 18 and the N-type base layer 20 is formed an N-type low impurity concentration layer 22 which is lower in impurity concentration than the N-type base layer 20. A first PN junction $J_1$ is formed between the P-type base layer 18 and the N-type low impurity concentration layer 22.

At an outer peripheral portion of the P-type base layer 18 and contiguous to the major surface 12 is formed an N-type emitter layer 24 with a second PN junction $J_2$ at the interface contiguous to the P-type base layer 18. At an outer peripheral portion of the N-type base layer 20 and contiguous to the major surface 14, on the other hand, is formed a P-type emitter layer 26 with a third PN junction $J_3$ at the interface contiguous to the N-type base layer 20.

At a portion, contiguous to the side surface 16, of the N-type base layer 20 is formed a high inpurity concentration region 28 which is higher in impurity concentration level than the N-type base layer 20.

A cathode electrode 30 and an anode electrode 32 are provided on the major surfaces 12 and 14, respectively, wherein both the N-type emitter layer 24 and the P-type base layer 18 are in contact with the cathode electrode 30 and both the N-type emitter layer 26 and the N-type base layer 20 are in contact with the anode electrode 32. A gate electrode 34 is provided on the P-type base layer 18. The resulting structure comprises at the outer peripheral portion of the semiconductor substrate 10 a thyristor region including the N-type emitter layer 24, the P-type base layer 18, the N-type low impurity concentration layer 22, the N-type base layer 20 and the P-type emitter layer 26, and a diode region at the central portion including the P-type base layer 18, the N-type low impurity concentration layer 22 and the N-type base layer 20, the thyristor and diode regions being connected in anti-parallel. The individual regions are formed in the semiconductor substrate 10 by known selective diffusing process, selective epitaxial growth process, or ion-implantation process. The side surface 16 is subjected to the positive bevelling in the vicinity of the N-type base layer 20 in order to lower field strength at the side surface 16.

Figure 2:
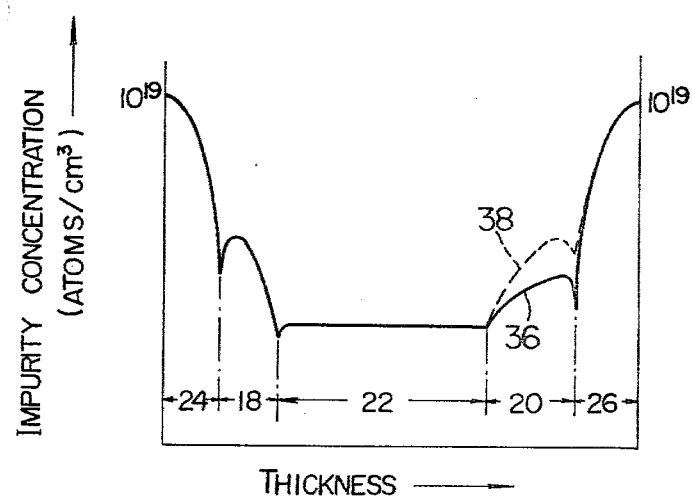
FIG. 2 is a graph showing an impurity concentration profile at the peripheral portion of the thyristor of FIG. 1.

Referring to FIG. 2, there is shown an impurity concentration profile in the thyristor region shown in FIG.

1, where curve 36 denotes an impurity concentration distribution in the N-type base layer 20 and curve 38 an impurity concentration distribution in the N-type high impurity concentration region 28.

Impurity concentrations in the N-type low impurity concentration layer 22, the central portion of the N-type base layer 20 and the N-type high impurity concentration region 28 are about $10^{13}$ to $10^{14}$ atoms/cm$^3$, about $10^{16}$ atoms/cm$^3$ and about $10^{17}$ atoms/cm$^3$, respectively.

When a forward voltage is applied to the reverse conducting type thyristor of the above construction, the PN junction $J_1$ is imparted with a reverse voltage and depletion layers spread in opposite sides of the PN junction. Spreading of the depletion layer is more extensive in the low impurity concentration layer 22 of the lower impurity concentration than in the P-type base layer 18, as shown in FIG. 1 at dashed lines. Particularly, being affected by the configuration of the side surface 16 and the surface conditions, a local spreading of the depletion layer tends to be accelerated at the outer peripheral portion of the thyristor.

In the above embodiment, however, the high impurity concentration region 28 which is higher in impurity concentration than the N-type base layer 20 is formed contiguous to the outer periphery of the N-type base layer 20 so that, as shown in FIG. 1 at the dashed lines, the depletion layer can be spread uniformly in both the N-type base layer 20 and the high impurity concentration region 28. Consequently, the punch-through voltage at the side surface of the thyristor region can be increased, thereby increasing the forward blocking voltage of the thyristor.

While a thyristor of 500 A rating current with the construction according to the above embodiment was freed from any punch-through at voltages up to about 2700 volts, a thyristor without the high impurity concentration region 28 suffered from a punch-through at 2400 volts. Without the high impurity concentration region 28, an impurity concentration in the N-type base layer 20 of $10^{17}$ atoms/cm$^3$ was with about 2700 volts forward voltage but in this case, the forward on-state voltage was increased from about 1.4 volts to 2.5 volts.

In the foregoing embodiment, due to the fact that the high impurity concentration region 28 is deviated from the current flow path of the thyristor region and that the forward on-state voltage is determined depending on the low impurity concentration layer 22, the N-type base layer 20 and the P-type emitter layer 26 of the thyristor region, the high impurity concentration region 28 does not substantially affect the forward on-state voltage. Accordingly, it is possible to increase the punch-through voltage without increasing the forward voltage.

The provision of the high impurity concentration region contiguous to the outer periphery of the N-type base layer in the foregoing embodiment will decrease the breakdown voltage of the third PN junction $J_3$. However, as far as the reverse conducting type thyristor is concerned, the third PN junction $J_3$ is in no way imparted with the reverse voltage, causing no problems in practical applications. In addition, a thyristor without the diode region may be valid for use with circuit components which are not placed in high reverse voltages, causing no problems in practice.

We claim:

1. A thyristor comprising:

a semiconductor substrate with a first major surface, a second major surface opposing said first major surface, and a side surface connecting said first and second major surfaces, said semiconductor substrate including a first emitter layer of one conductivity type contiguous to said first major surface, a second emitter layer of an opposite conductivity type contiguous to said second major surface, a first base layer of said opposite conductivity type contiguous to said first emitter layer, a second base layer of said one conductivity type contiguous to said second emitter layer, a low impurity concentration layer of said one conductivity type interposed between said first and second base layers and having an impurity concentration lower than that of said second base layer, and a high impurity concentration region of said one conductivity type contiguous, on one hand, to the outer periphery of said second base layer and on the other hand, to said side surface of said semiconductor substrate and having an impurity concentration higher than that of said second base layer;

a cathode electrode in contact with said first emitter layer;

an anode electrode in contact with said second emitter layer; and a gate electrode in contact with said first base layer.

2. A thyristor according to claim 1, wherein said side surface of said semiconductor substrate is subjected to positive bevelling at least said second base layer.

3. A thyristor comprising:

a semiconductor substrate with a first major surface, a second major surface opposing said first major surface, and a side surface connecting said first and second major surfaces, said semiconductor substrate including a first base layer of one conductivity type contiguous to said first major surface, a second base layer of an opposite conductivity type contiguous to said second major surface, a first emitter layer of said opposite conductivity type contiguous, on one hand, to the outer periphery of said first base layer and on the other hand, to said first major surface, said first emitter layer being cooperative with said first base layer to form a PN junction, a second emitter layer of said one conductivity type contiguous, on one hand, to the outer periphery of said second base layer and on the other hand, to said second major surface and said side surface, said second emitter layer being cooperative with said second base layer to form a PN junction, a low impurity concentration layer of said opposite conductivity type interposed between said first and second base layers and having an impurity concentration lower than that of said second base layer, and a high impurity concentration region of said opposite conductivity type contiguous, on one hand, to the outer periphery of said second base layer and on the other hand, to said side surface of said semiconductor substrate and having an impurity concentration higher than that of said second base layer;

a cathode electrode in contact with said first emitter layer and said first base layer;

an anode electrode in contact with said second emitter layer and said second base layer; and a gate electrode in contact with said first base layer, whereby said first base layer, said low impurity concentration layer and said second base layer form a diode region at the central portion of said semiconductor substrate while said first emitter layer, said first base layer, said low impurity concentration layer, said second base layer and said second emitter layer form a thyristor region at the outer peripheral portion of said semiconductor substrate, said diode and thyristor regions being connected in anti-parallel.

4. A thyristor according to claim 3, wherein said high impurity concentration region is formed outside a region originating from projecting said first emitter layer upon the current flow path in said semiconductor substrate.

* * * * *